(12) United States Patent
Nagumo

(10) Patent No.: US 7,961,209 B2
(45) Date of Patent: Jun. 14, 2011

(54) INTEGRATED CIRCUIT THAT EMITS LIGHT, OPTICAL HEAD THAT INCORPORATES THE INTEGRATED CIRCUIT, AND IMAGE FORMING APPARATUS THAT USES THE OPTICAL HEAD

(75) Inventor: Akira Nagumo, Hachioji (JP)

(73) Assignee: Oki Data Corporation, Tokyo (JP)

( * ) Notice: Subject to any disclaimer, the term of this patent is extended or adjusted under 35 U.S.C. 154(b) by 1292 days.

(21) Appl. No.: 11/512,342

(22) Filed: Aug. 30, 2006

(65) Prior Publication Data

US 2007/0058030 A1    Mar. 15, 2007

(30) Foreign Application Priority Data

Sep. 13, 2005  (JP) .................. 2005-265079

(51) Int. Cl.
*B41J 2/435*     (2006.01)
*B41J 2/47*      (2006.01)
(52) U.S. Cl. ...................... 347/237; 347/247
(58) Field of Classification Search .......... 347/237, 347/238, 247
See application file for complete search history.

(56) References Cited

U.S. PATENT DOCUMENTS

| 5,451,977 A | * | 9/1995 | Kusuda et al. ................ 345/44 |
| 5,814,841 A |   | 9/1998 | Kusuda et al. |
| 2004/0135875 A1 | * | 7/2004 | Wakisaka .................. 347/238 |

FOREIGN PATENT DOCUMENTS

| JP | 2577089 | 10/1990 |
| JP | 09099580 | 4/1997 |
| JP | 11179954 | 7/1999 |
| JP | 2003063065 | 3/2003 |

* cited by examiner

*Primary Examiner* — Hai C Pham
(74) *Attorney, Agent, or Firm* — Rabin & Berdo, PC

(57) ABSTRACT

Each of a plurality of driver circuits includes a first 3-terminal switch element, a second 3-terminal switch element, and a 3-terminal light emitting element driven by the first 3-terminal switch element. The first 3-terminal switch element in a first circuit of adjacent driver circuits is driven by one of first and second clocks and the first 3-terminal switch element in a second circuit of the adjacent driver circuits is driven by the other of the first and second clocks. The second 3-terminal switch element in the first circuit supplies a signal to the second driver circuit, the signal representing an operational state of the first circuit. The second 3-terminal switch element in the first circuit includes a control electrode to which a third clock is supplied. The second 3-terminal switch element in the second circuit includes a control electrode to which a fourth clock is supplied.

8 Claims, 8 Drawing Sheets

INTEGRATED CIRCUIT THAT EMITS LIGHT, OPTICAL HEAD THAT INCORPORATES THE INTEGRATED CIRCUIT, AND IMAGE FORMING APPARATUS THAT USES THE OPTICAL HEAD

BACKGROUND OF THE INVENTION

1. Field of the Invention

The present invention relates to an integrated circuit that emits light, an optical head that uses the integrated circuit, and an image forming apparatus that uses the optical head.

2. Description of the Related Art

FIG. 8 illustrates a conventional light emitting apparatus disclosed in Japanese Patent No. 2577089.

Referring to FIG. 8, a conventional self-scanning type light emitting apparatus includes a plurality of circuits C(−1), C(0), C(1), C(2), . . . connected in cascade, each of the plurality of circuits including a light emitting element and a transfer element.

The light emitting elements L(−1), L(0), L(1), are light emitting thyristors having a PNPN configuration.

The cathodes of the transfer elements T(−1), T(0), T(1), and the light emitting elements L(−1), L(0), L(1), . . . are connected to the ground. The gates of transfer elements T(−1), T(0), T(1), . . . and light emitting elements L(−1), L(0), L(1), . . . are connected to a power supply $V_{GK}$ through resistors $R_L$.

Diodes D(−1), D(0), D(1), . . . are connected between adjacent ones of the plurality of circuits. The cathodes of the diodes are connected to the gates of transfer elements and the gate electrodes of the light emitting elements of a preceding one of adjacent circuits. The anodes of the diodes D(−1), D(0), D(1), . . . are connected to the gates of transfer elements and the gate electrodes of the light emitting elements of a following one of the adjacent circuits.

The anodes of the transfer elements T(−1), T(1), . . . are connected to a φ2 terminal. The anodes of the transfer elements T(0), T(2), . . . are connected to a φ1 terminal. Clock signals are fed to the φ1 terminal and the φ2 terminal, and a write signal $S_{in}$ is fed to a $S_{in}$ terminal to control light emission of the light emitting elements L(−1), L(0), L(1), . . . .

The anodes of the light emitting elements L(−1), L(0), L(1), . . . are connected to the $S_{in}$ terminal.

Such a light emitting apparatus is configured such that the transfer elements T(−1), T(0), T(1), . . . and the light emitting elements L(−1), L(0), L(1), . . . are separately implemented, and that the write signal $S_{in}$ is fed to the light emitting elements L(−1), L(0), L(1), . . . via the $S_{in}$ terminal. Therefore, the circuit configuration of the light emitting apparatus can be apparently simplified.

Assume that the transfer element T(0) is in the ON state, the gate electrode of the transfer element (T(0)) is nearly at zero volts, lower than the supply $V_{GK}$ (e.g., 5 V). The write signal $S_{in}$ higher than the diffusion voltage of a pn junction (approximately 1 V) of the light emitting element L(0) is high enough to cause the light emitting element L(0) to turn on.

At this moment, the transfer element T(−1) is in the OFF state. The potential of the gate electrode of the transfer element T (−1) is approximately equal to $V_{GK}$ so that the diode D(1) is reverse-biased to allow some charges on the gate of the transfer element (T(−1) to flow into the gate of the transfer element T(1).

At this moment, the transfer element T(1) is also in the OFF state. Thus, the diode D(0) is forward-biased through the resistor RL in the circuit C(1), so that the potential of the gate of the transfer element T(1) is substantially equal to the forward voltage of the diode D(0) (e.g., approximately 1 V).

Thus, the voltage of the write signal $S_{in}$ required for turning on the light emitting element L(1) is about 2 V, which is the sum of the forward voltage of the diode D(0) and the diffusion voltage of the pn junction of the light emitting element L(1). Thus, the voltage of write signal $S_{in}$ required for turning on the light emitting element L(−1) is approximately 6 V.

In other words, the voltages of the clocks φ1 and φ2 for driving the transfer elements T(−1), T(0), T(1), . . . should be in the rage of 1 to 2 V. If the voltage of the clock φ2 exceeds 1 to 2 V (e.g., 3 V) momentarily due to noise, the momentarily increased voltage is applied to the anode electrode of the transfer element T(1) and is fed to the diodes D(1) and D(0) through the gate of the transfer element T(1), thereby creating a current path of D(0)→D(−1)→T(−1)→ground. In other words, a small amount of noise in the signal supplied from the φ1 terminal or the φ2 terminal causes the transfer elements T(−1), T(0), T(1), . . . to malfunction. In addition, the write signal $S_{in}$ should be in a narrow voltage range in order to ensure the normal operation of the light emitting apparatus.

SUMMARY OF THE INVENTION

The present invention was made in view of the aforementioned problems.

An object of the invention is to provide a self-scanning type integrated circuit whose operation is immune to a small amount of noise and whose write signal is free from the amplitude requirement for the normal operation.

An integrated circuit emits light the integrated circuit. Each of a plurality of driver circuits includes a first 3-terminal switch element, a second 3-terminal switch element, and a 3-terminal light emitting element driven by the first 3-terminal switch element. The first 3-terminal switch element in a first one of two adjacent driver circuits is driven by one of a first clock and a second clock. The first 3-terminal switch element in a second one of the two adjacent driver circuits is driven by the other of the first clock and the second clock. The second 3-terminal switch element in the first one of the two adjacent driver circuits supplies a signal to the second one of the two adjacent driver circuits, the signal representing an operational state of the first one of the two adjacent driver circuits. The second 3-terminal switch element in the first one of the two adjacent driver circuits includes a first control electrode to which one of a third clock and a fourth clock that are different in rising timing and falling timing is supplied. The second 3-terminal switch element in the second one of the two adjacent driver circuits includes a second control electrode to which the other of the third clock and the fourth clock is supplied.

The second 3-terminal switch element is a transistor.

The 3-terminal light emitting element is driven by a data signal supplied to the 3-terminal light emitting element, the data signal driving the 3-terminal light emitting element at a timing and for a time length.

An optical print head incorporates the aforementioned integrated circuit. The optical print head includes an optical system that focuses light emitted from the integrated circuit.

An image forming apparatus incorporates the optical head. An image bearing body is rotatably supported to face the optical head so that the optical head forms an electrostatic latent image on a surface of said image bearing body.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

Embodiments of the invention will be described in detail with reference to the accompanying drawings.

First Embodiment

{Construction}

Figure 1:
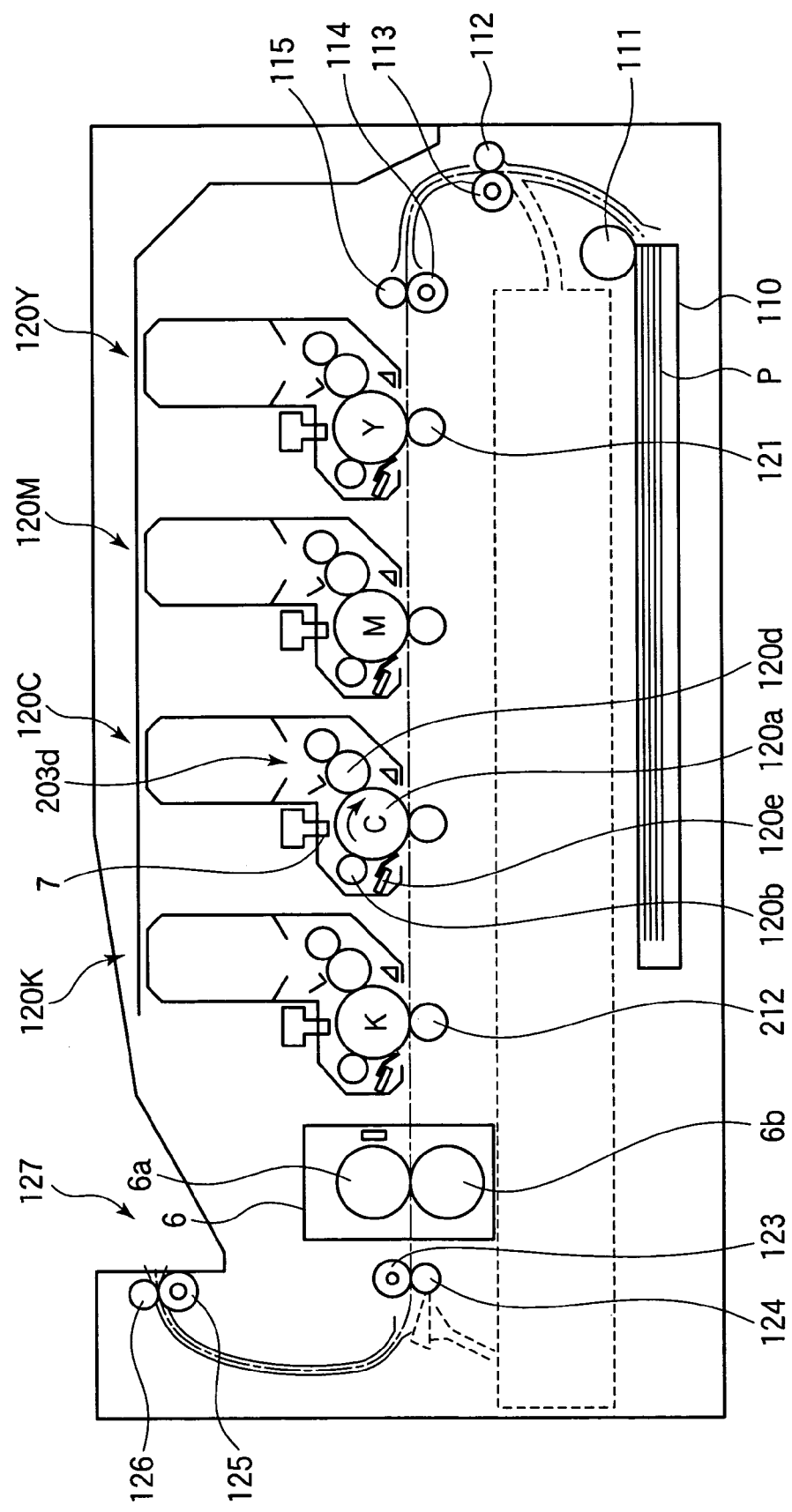
FIG. 1 illustrates an image forming apparatus according to the present invention.

FIG. 1 illustrates an image forming apparatus according to the present invention. Referring to FIG. 1, the image forming apparatus includes a medium cassette 110 that holds a stack of a recording medium P. A hopping roller 111 rotates in contact with the top page of the stack of the recording medium P, thereby feeding the recording medium P into a transport path on a page-by-page basis. The recording medium P is transported along the transport path to a process unit 120Y. A pinch roller 112 and a feed roller 113 are disposed in the middle of the transport path, and cooperate to transport the recording medium P toward the process unit 120Y while also holding the recording medium P between them in sandwiched relation. A pinch roller 115 and a registration roller 114 are disposed downstream of the pinch roller 112 and feed roller 113 at the end of the transport path, and cooperate to feed the recording medium P to the process unit 120Y in timed relation with an operation of the process unit 120Y in which an image is formed.

Process units 120Y, 120M, 120C, and 120K are aligned in this order along the transport path in which the recording medium P is transported. Each of the process units 120Y, 120M, 120C, and 120K may be substantially identical; for simplicity only the operation of the process unit 120Y for forming yellow images will be described, it being understood that the other process units 120M, 120C, and 120K may work in a similar fashion.

The process unit 120Y includes a photoconductive drum 120a as an image bearing body. Disposed around the photoconductive drum 120a are a charging unit 120b, an exposing unit 120f, a developing unit 120d, and a cleaning unit 120e aligned in this order from upstream to downstream with respect to the rotation of the photoconductive drum 120a.

A transfer roller 121 is formed of an electrically semi-conductive rubber material, and opposes the photoconductive drum 120a. A voltage is applied to the transfer roller 121 to create a potential between the surface of the photoconductive drum 120a and the transfer roller 121, so that when the recording medium passes through a transfer region defined between the photoconductive drum 120a and the transfer roller 121, a toner image formed on the photoconductive drum 120a is transferred onto the recording medium P with the aid of the potential difference between the photoconductive drum 120a and the transfer roller 121.

The charging unit 120b charges the surface of the photoconductive drum 120a. The exposing unit 120f takes the form of a print head 7 incorporating the integrated circuit 8. Upon receiving print data, the print head 7 of the exposing unit 120f is driven to selectively illuminate the charged surface of the photoconductive drum 120a in accordance with print data, thereby forming an electrostatic latent image on the photoconductive drum 120a. The toner is charged to a polarity opposite to the bias voltage applied to the image bearing body. The developing unit 120d supplies the charged toner to the electrostatic latent image formed on the photoconductive drum 120a, thereby forming a toner image. The transfer roller 121 transfers the toner image onto the recording medium P. The cleaning unit 120e removes the remaining toner from the surface of the photoconductive drum 120a after transfer of the toner image.

The aforementioned electrophotographic image forming process is performed in each of the process units 120Y, 120M, 120C, and 120K as the recording medium P passes through the process units 120Y, 120M, 120C, and 120K in sequence, so that toner images of corresponding colors are transferred onto the recording medium P in registration.

A fixing unit 6 is located downstream of the process unit 120K. The fixing unit 6 includes a fixing roller 6a and a back-up roller 6b that cooperate with each other to hold the recording medium P in sandwiched relation.

When the recording medium P passes through a fixing region defined between the fixing roller and back-up roller, the toner image is fused by heat and pressure into a permanent image. After fixing, the recording medium P is transported by a pinch roller 123 and a discharge roller 124, and then by a pinch roller 125 and a discharge roller 126 onto a stacker 127.

Figure 2:
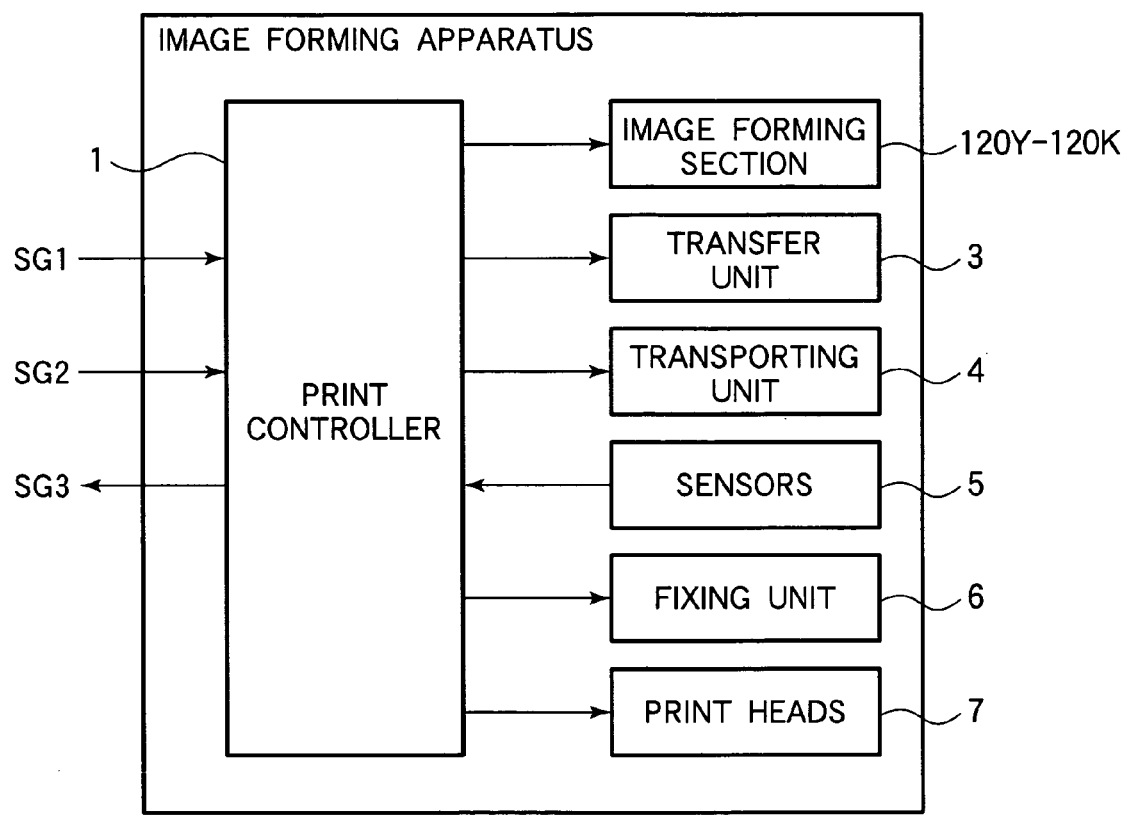
FIG. 2 is a block diagram illustrating the image forming apparatus.

FIG. 2 is a block diagram illustrating an image forming apparatus. A print controller 1 receives a video signal SG2 (print data) from an external information processing apparatus, not shown, and controls the respective sections in the image forming apparatus to form images on the recording medium P such as paper in accordance with the print data. Under control of the print controller 1, the process unit 120Y, 120M, 120C, and 120K form toner images of corresponding colors, respectively. A transfer unit 3 includes transfer rollers to which a bias voltage is applied. The bias voltage has an opposite polarity to that applied to the image bearing body. The transfer unit 3 transfers the toner images of the corresponding colors from the photoconductive drums onto the recording medium P. A transporting unit 4 includes a transporting belt that runs to transport the recording medium P through the process unit 120Y, 120M, 120C, and 120K. Sensors 5 are disposed at various locations in the image forming apparatus to detect the operational states of the respective sections. The fixing unit 6 fixes the toner image on the recording medium P. The print heads 7 illuminate the charged surfaces of the corresponding photoconductive drums in accordance with the print data.

The print controller 1 sends necessary signals to the process units 120Y-120K, transfer unit 3, transporting unit 4, sensors 5, and print heads 7 to control these sections. The print controller 1 sends a timing signal SG3 to the information processing apparatus, and receives the video signal SG2 and a control signal SG1 from the information processing apparatus. The video signal SG2 represents print data, and the control signal SG1 controls the image forming apparatus.

The sensors 5 includes sensors that detect the location of the recording medium P being transported by the transporting unit, a medium size sensor that detects the size of the recording medium P, a remaining medium sensor that detects the remaining amount of the recording medium P, and a temperature sensor that detects the temperature of the fixing unit 6. The respective sensors send their detection signals to the print controller 1.

The print head 7 includes a circuit 8 that emits light. The controller 1 outputs print data to the circuit 8, and then produces drive signals in accordance with the print data. The drive signals control the light-emitting elements of the circuit 8 to emit light to form an electrostatic latent image on the image bearing body. Specifically, the print head 7 operates in accordance with a plurality of clocks and data signal, which will be described later in detail, to drive light-emitting elements in sequence with its scanning function.

{Print Head}

Figure 3:
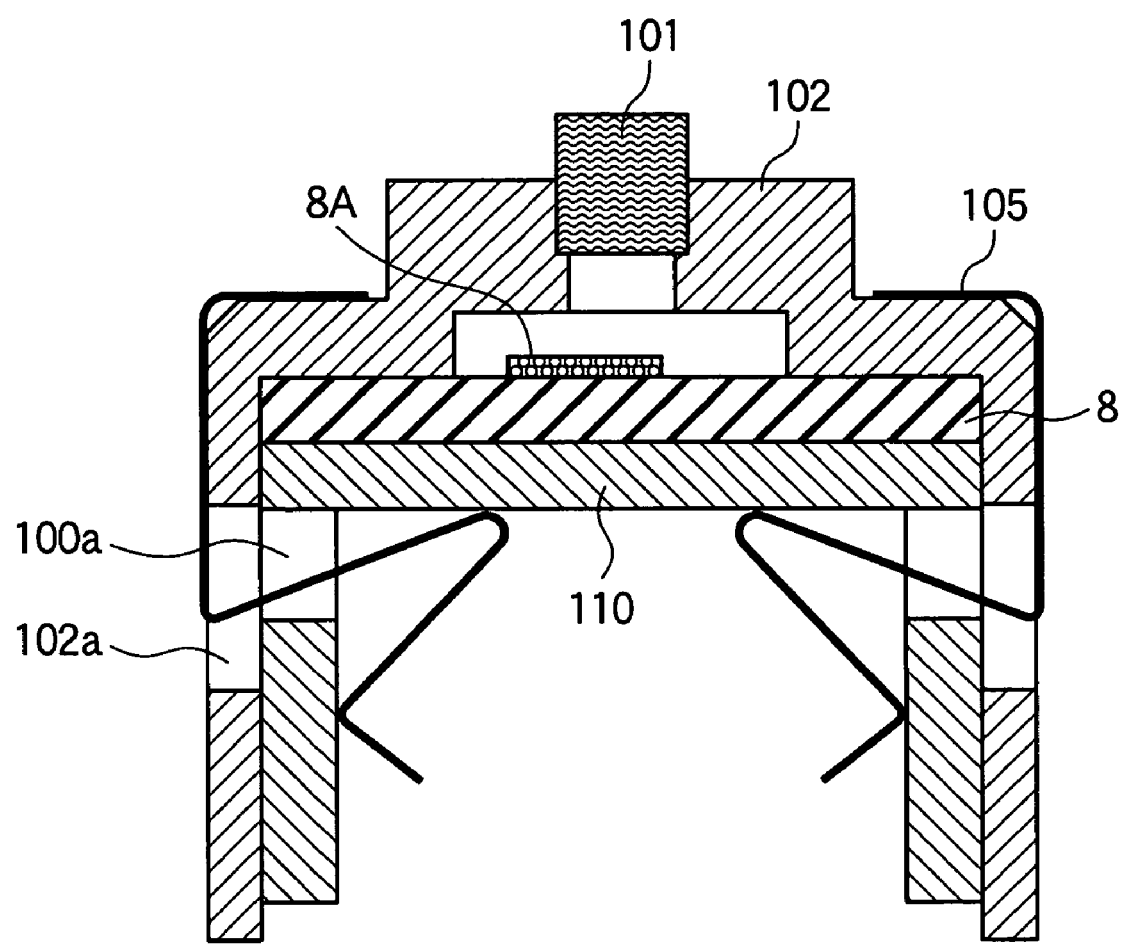
FIG. 3 is a cross-sectional side view illustrating a print head.

FIG. 3 is a cross-sectional view illustrating the print head 7. The specific configuration of the print head 7 will be described in detail.

Referring to FIG. 3, the integrated circuit 8 for emitting light is mounted on a base 100. A light emitting array 8A is mounted on the integrated circuit 8. A rod lens array 101 is disposed over light emitting elements on the light emitting array 8A. The rod lens array 101 includes a plurality of cylindrical lenses aligned parallel to a line of the light emitting elements. The rod lens array 101 is firmly mounted on a lens holder 102.

The lens holder 102 is formed with openings 102a, and the base 100 is formed with openings 100a. The lens holder 102 fits over the base 100 to enclose the integrated circuit 8 and light emitting array 8A. Clampers 105 are mounted to the lens holder 102 and base 100 through the openings 102a and 100a to hold the integrated circuit 8 between the lens holder 102 and base 100 in sandwiched relation.

After the print head 7 has been mounted to the process unit, the rod lens array focuses light emitted from the light emitting array 8A on the surface of the photoconductive drum.

{Integrated Circuit}

Figure 4:
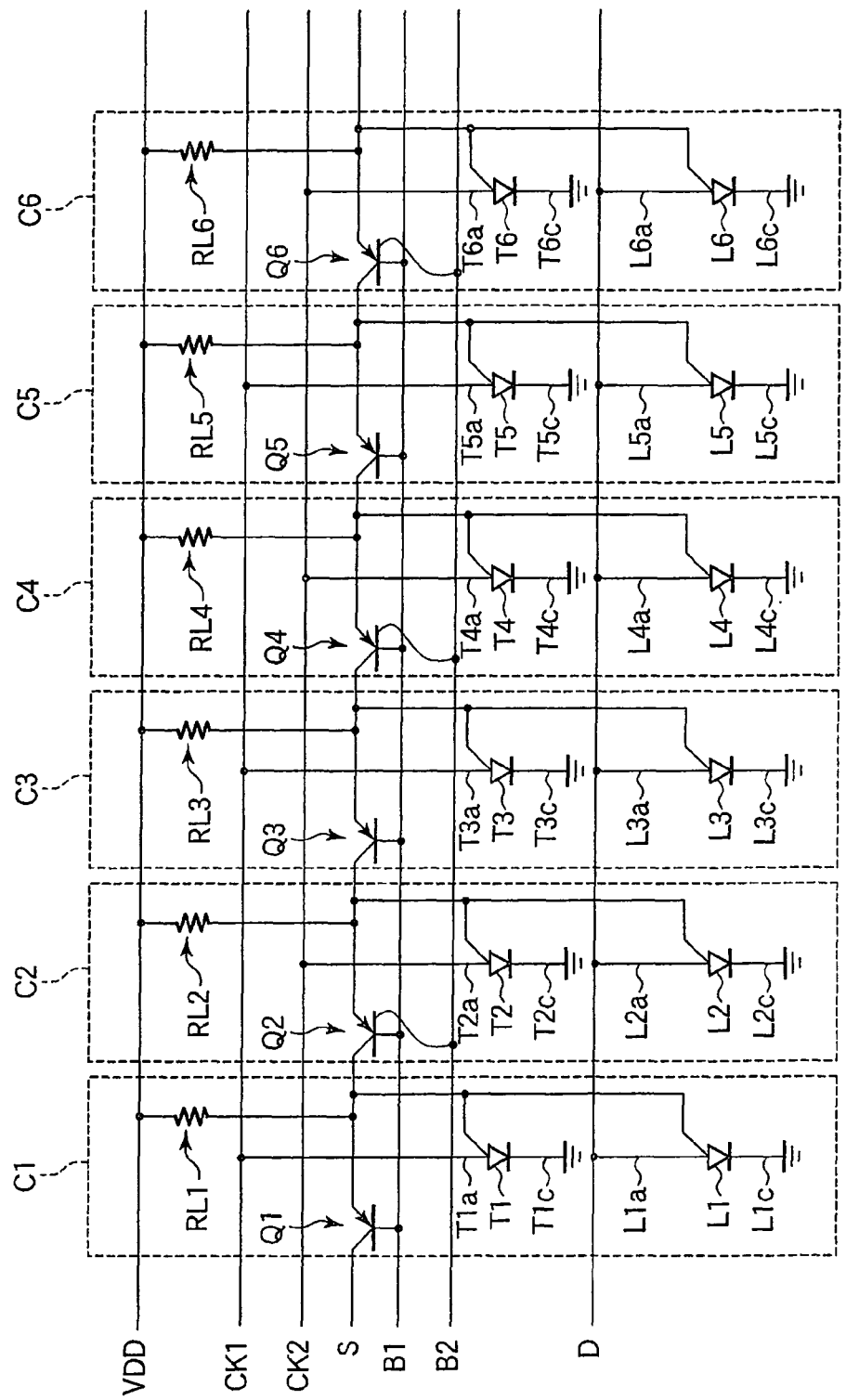
FIG. 4 illustrates an integrated circuit of a first embodiment.

The specific configuration of the print head 7 will be described. FIG. 4 illustrates the integrated circuit 8.

The integrated circuit 8 is configured to perform the function of self-scanning, and forms an electrostatic latent image on the surface of the photoconductive drum. A preceding driver circuit of adjacent two driver circuits feeds a signal indicative of the operational state of the preceding driver circuit to a following driver circuit of the adjacent two driver circuits. The following driver circuit then drives a corresponding light emitting element using the signal received from the preceding driver circuit, clock signals, and a data signal. The integrated circuit 8 repeats the aforementioned operation in sequence for all of the driver circuits and corresponding light emitting elements, thereby forming an electrostatic latent image.

Referring to FIG. 4, the integrated circuit 8 includes a plurality of driver circuits, for example, C1-C6. It should be noted that the thyristors T1-T6 do not have to be formed as a light emitting thyristor for the following reasons. The integrated circuit 8 of the present embodiment is manufactured as a monolithic IC using a GaAs substrate. Because the integrated circuit 8a is fabricated on a GaAs substrate, the thyristors T1-T6 are formed as a light emitting thyristor. However, the thyristors T1-T6 need not be a light emitting thyristor, and may be a non-light emitting thyristor. When the thyristors T1-T6 take the form of a light emitting thyristor, the light emitting thyristors T1-T6 may be covered with a metal layer to block the light emitted from the light emitting thyristors T1-T6.

Each of the driver circuits may be substantially identical; for simplicity only the operation of the driver circuit C1 will be described, it being understood that the other driver circuits may work in a similar fashion.

The driver circuit C1 includes a resistor RL1, a transistor Q1, a thyristor T1, and a light emitting thyristor L1, which are electrically connected to one another and are driven by the clock signals CK1 and B1 and a data signal D. The thyristor T1 serves as a 3-terminal light emitting element. Alternatively, a light emitting transistor may also be used in place of the 3-terminal light emitting element. A supply voltage is supplied to a VDD terminal for driving the thyristors T1 and L1. Clock signals CK1 and B1 are supplied to a CK1 terminal and a B1 terminal, respectively. A start signal S is supplied to an S terminal, and the data signal D is supplied to a D terminal. The clock signal B1 drives the transistor Q1, which in turn drives the gate of the thyristor T1. When the thyristor T1 remains on, the data signal D is fed to the light emitting thyristor L1 to turn on the light emitting thyristor L1 so that the light emitting thyristor L1 emits light.

The thyristors T1 and L1 have their cathodes connected to the ground and their gates connected to one end of the resistor RL1. The anode of the thyristor T1 is connected to the CK1 terminal and the anode of the thyristor L1 is connected to the D terminal. The gate of the thyristor T1 is connected to the emitter of the transistor Q1 and the collector of the transistor Q2 of the driver circuit C2. The transistor Q1 has a collector connected to the S terminal and a base connected to the B1 terminal. The transistor Q1 is driven by the clock signal B1 supplied to the B1 terminal.

Except that the bases of the transistors Q2, Q4, and Q6 of the driver circuits C2, C4, and C6 are connected to the B2 terminal and that the anodes of the thyristors T2, T4, and T6 are connected to the CK2 terminal, the driver circuits C2, C4, and C6 have the same configuration as the driver circuit C1. Likewise, the driver circuits C3 and C5 also have the same configuration as the driver circuit C1.

Figure 5A:
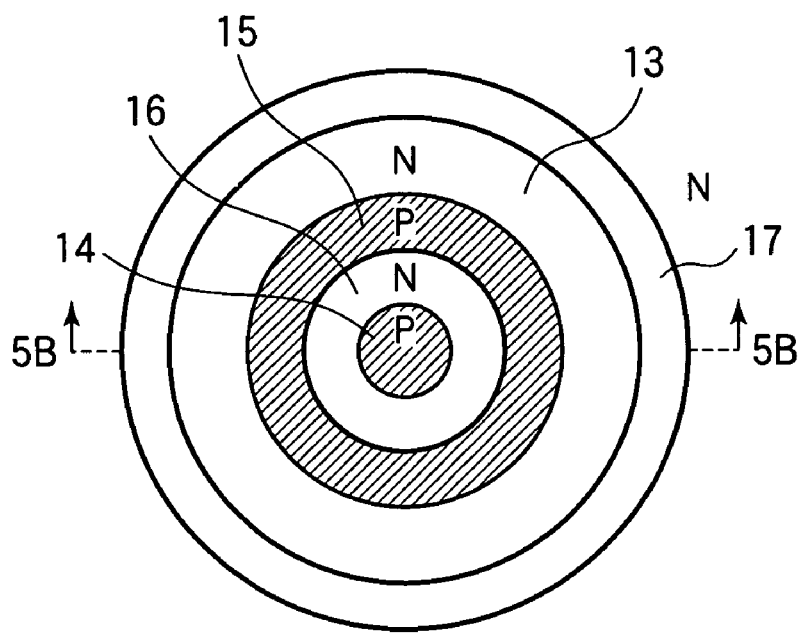
FIG. 5A is a top view of a PNP type transistor.
Figure 5B:
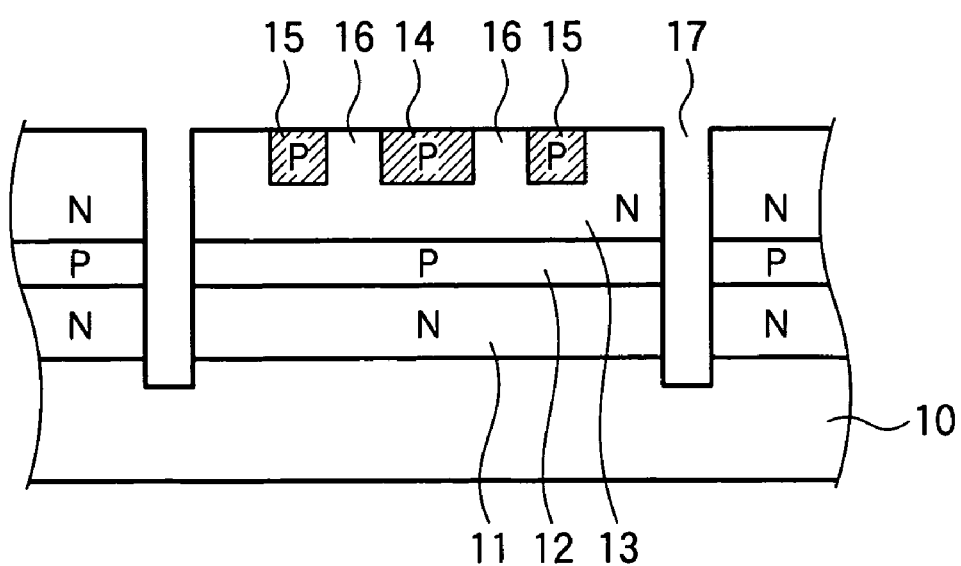
FIG. 5B is a cross-sectional view taken along a line 5B-5B of FIG. 5A.

FIG. 5A is a top view of a PNP type transistor. FIG. 5B is a cross-sectional view taken along a line 5B-5B of FIG. 5A.

Referring to FIG. 5A, a P-type region 14 and a P-type region 15 are spaced apart with an N-type region 16 located between the P-type region 14 and P-type region 15 such that the P-type region 15 is a ring-shaped region concentric to the P-type region 14. The P-type region 14 and P-type region 15 are formed by diffusing an impurity such as zinc into the N type layer 13. The P-type region 14, P-type region 15, and N-type region 16 form each one of PNP lateral bipolar transistors Q1-Q6, serving as a collector, an emitter and a base, respectively.

The P-type region 14, and N-type region 16, and a P-type region 15 form a PNP type bipolar transistor. The P-type region 14 is a collector electrode, the N-type region 16 is a base electrode, and the P-type region 15 is an emitter electrode. A P-type layer 12 and an N-type layer 11 are formed on a substrate 10 to electrically isolate the PNP type bipolar transistor from a substrate 10.

Referring to FIG. 5B, the substrate 10 is a GaAs substrate, which is a lightly doped semi-insulating material. The N-type layer 11, P-type layer 12, and N-type layer 13 are formed by epitaxial growth of AlGaAs in this order by metal organic chemical vapor deposition (MO-CVD) on the substrate 10, and are etched to form grooves 17, thereby defining individual cylinders of the layers. Alternatively, the N-type layer 11, P-type layer 12, and N-type layer 13 may be in the shape of a quadratic prism or a hexagonal prism.

{Operation of Integrated Circuit}

Figure 6:
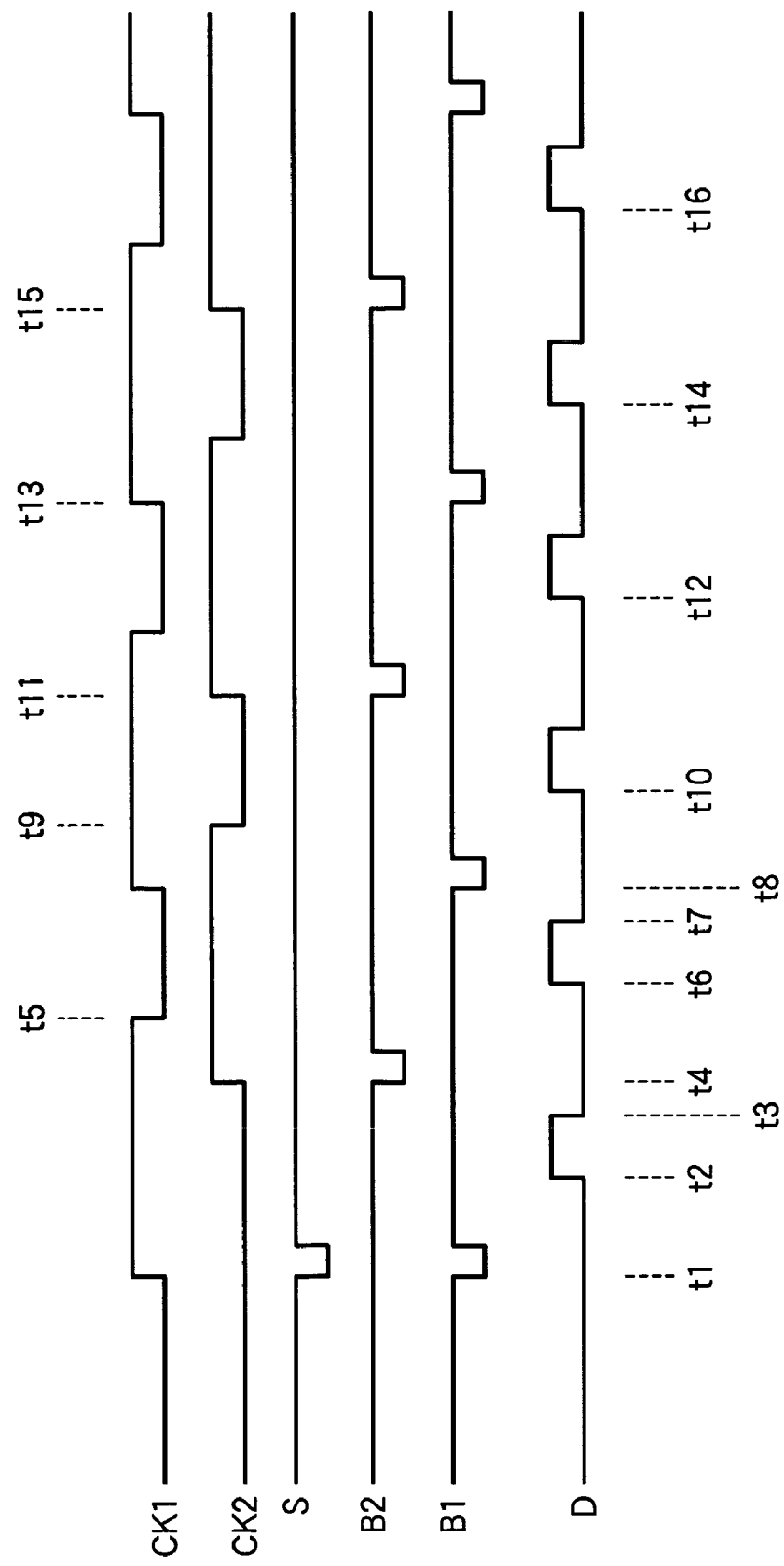
FIG. 6 is a timing chart of an integrated circuit according to the first embodiment.

FIG. 6 is a timing chart of the integrated circuit. The clock signals CK1 and CK2 drive the light emitting thyristors L1-L6 while the clock signals B1 and B2 drive transistors Q1-Q6.

The specific operation will be described with reference to FIG. 6.

Referring to FIG. 6, a start signal S is to initiate the operation of the integrated circuit 8. At time t1, the start signal S goes low, the clock signal CK1 goes high, and the clock signal B1 goes low. The low level of clock signal B1 causes a base current to flow from the emitter to the base of the transistor Q1, bringing the emitter-collector region of the transistor Q1 into an ON state. Thus, the potential of the emitter of the transistor Q1 goes low, creating a potential difference between the anode and gate of the thyristor T1. At this moment, the thyristor T1 becomes ON. Because the emitter of the transistor Q1 is connected to the gate of the light emitting thyristor L1, the gate of the light emitting thyristors L1 also goes low. It is to be noted that as long as the thyristor T1 remains in the ON state, the potential of the gate of the thyristor T1 remains low. In other words, the gate of the thyristor T1 serves as a memory element that holds the operational state of the driver circuit C1. The low level at the gate of the thyristor T1 represents that the driver circuit C1 is operating or active, i.e., the light emitting element L1 is ready to emit light upon the data signal D.

At time t2, the data signal D goes high, creating a potential difference between the anode and gate of the light emitting thyristor L1, so that the light emitting thyristor L1 turns on to emit light.

The data signal D serves as a signal that controls the ON-OFF state of the light emitting thyristor L1. The data signal D not only controls the ON-OFF states of the light emitting thyristors L1-L6 but also serves as a strobe signal that determines an amount of time for the print head 7 to illuminate the charged surface of the image bearing body, not shown, to form an electrostatic latent image.

At time t4, the clock signal CK2 goes high and the clock signal B2 goes low. At this moment, because the collector of the transistor Q2 is connected to the gate of the thyristor T1, the collector of the transistor Q2 is still low. The low level of the clock signal B2 causes a base current to flow through the emitter-base region of the transistor Q2, bringing the emitter-collector region of the transistor Q2 into an ON state. Thus, the potential of the emitter of the transistor Q2 goes low, creating a potential difference between the anode and gate of the thyristor T2 so that the thyristor T2 becomes ON.

At time t5, the clock signal CK1 goes low, so that the potential difference between the anode and cathode of the thyristor T1 become zero. Thus, the thyristor T1 turns off.

At time t6, the data signal D goes high to turn on the light emitting thyristor L2.

At time t7, the data signal D goes low, so that the potential difference between the anode and cathode of the light emitting thyristor L2 become zero. Thus, the light emitting thyristor L2 turns off.

At time t8, the thyristor T2 still remains ON, so that the gate of the thyristor T2 is still low. In other words, the gate of the thyristor T2 serves as a memory element that holds the operational state of the driver circuit C2. The clock CK1 goes high again and the clock signal B1 goes low again, so that the thyristor T3 becomes ON.

Likewise, the remaining circuits C3, C4, C5, and C6 of the integrated circuit 8 operate, so that thyristors T2 turns off at time t9, and the light emitting thyristors L3, T4, L4, T5, L5, T6, and L6 turn on at times t10, t11, t12, t13, t14, t15, and t16, respectively.

As described above, the clock signals CK1 are applied to the thyristors T1, T3, and T5 in the odd-numbered driver circuits C1, C3, and C5, and the clock signals CK2 are applied to the thyristors T2, T4, and T6 in the even-numbered driver circuits C2, C4, and C6. Further, the clock signals B1 are applied to the transistors Q1, Q3, Q5 in the odd-numbered driver circuits C1, C3, and C5, and the clock signals B2 are applied to the transistors Q2, Q4, Q6 in the even-numbered driver circuits C2, C4, and C6. The clock signals CK1 and CK2 are different in phase, and the clock signals B1 and B2 are different in phase, so that the light emitting thyristors L1-L6 are driven one at a time to emit light in sequence to form an electrostatic latent image on the photoconductive drum in accordance with the video signal SG1.

The write signal $S_{in}$ in the conventional apparatus disclosed in, for example, Japanese Patent No. 2577089 is required to be in the range of 1-2 V in order to prevent malfunction of the circuit. In contrast, the integrated circuit 8 is advantageous in that the gate of a thyristor in one of two adjacent driver circuits can be isolated from the gate of another thyristor in the other of the two adjacent driver circuits. Thus, the gate of a light emitting thyristor L of only a driver circuit selected from a plurality of driver circuits is driven by a drive signal having a sufficient amplitude. This configuration not only prevents the driver circuits from malfunctioning but also improves noise margin of the driver circuits.

The integrated circuit 8 can be applied to the print head 7, which in turn can be applied to an image forming apparatus. Such an image forming apparatus offers high quality images.

Second Embodiment

Just as in the first embodiment, an integrated circuit of a second embodiment is configured to perform the function of self-scanning, and may also be applied to a print head for image forming apparatuses.

Figure 7:
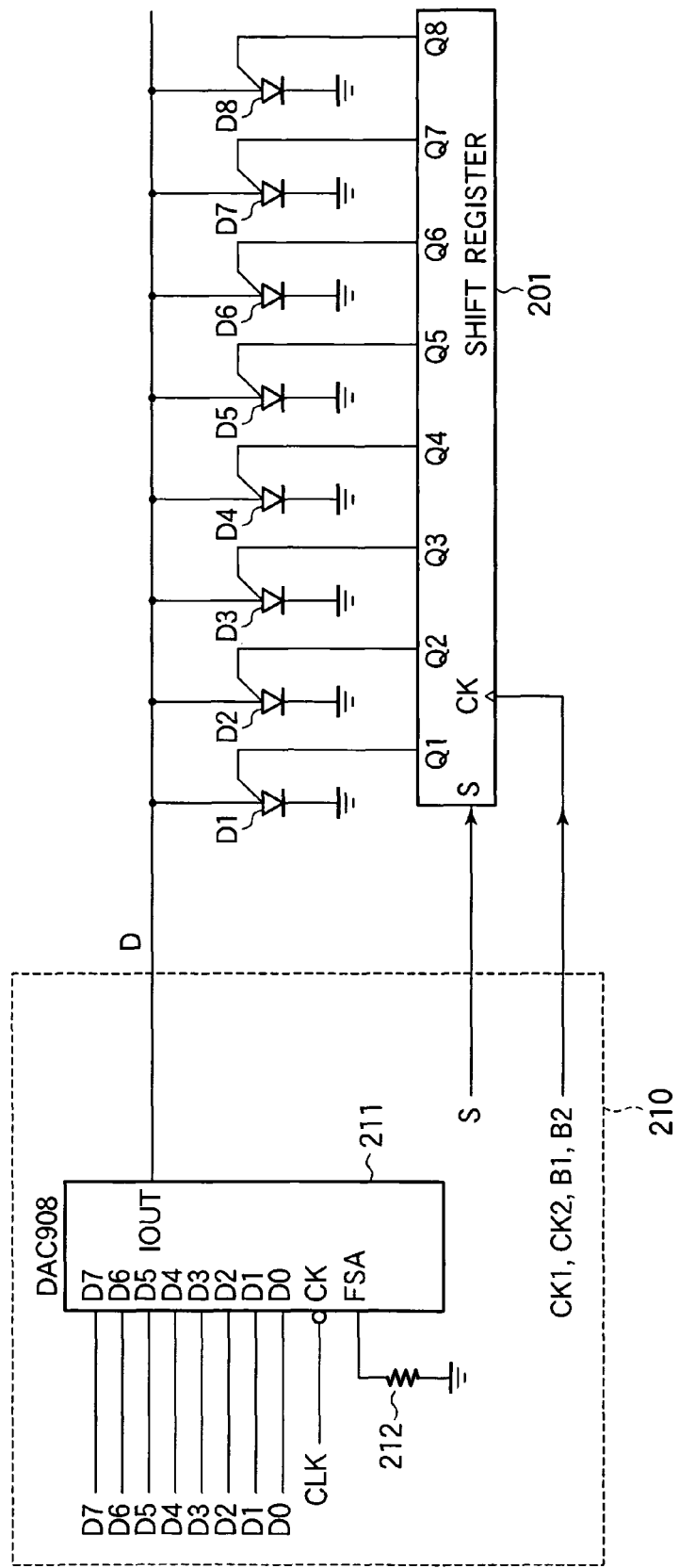
FIG. 7 illustrates a part of an integrated circuit of a second embodiment.
Figure 8:
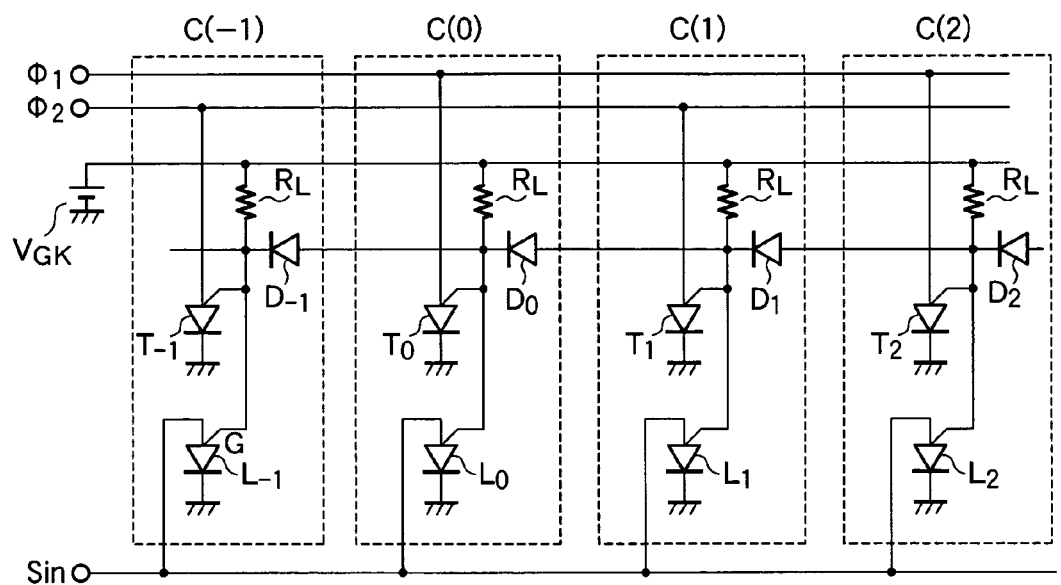
FIG. 8 illustrates a conventional integrated circuit that emits light.

FIG. 7 illustrates part of an integrated circuit for emitting light.

Referring to FIG. 7, the integrated circuit includes light emitting thyristors D1, D2, D3, . . . and a shift register 201. The operation of the integrated circuit is initiated by a start signal S and the pulses of a clock signal supplied to a CK terminal of the shift register 201 cause the shift register 201 to energize the light emitting thyristors D1, D2, D3, . . . in sequence, so that one of the light emitting thyristors D1, D2, D3, . . . is energized at a time for a predetermined length of time in accordance with a data signal D. The integrated circuit is driven by a driver circuit 210, which resides in a print controller, not shown.

The light emitting thyristors D1-D8 are of the same configuration as the light emitting thyristors L1-L6 in the first embodiment. The anodes of the light emitting thyristors D1-D8 are connected to one another, and are connected to an IOUT terminal of the driver circuit 210. The cathodes of the light emitting thyristors D1-D8 are connected to the ground, and the gate is connected to corresponding output terminals Q1-Q8 of the shift register 201.

The shift register 201 receives the start signal S via an S terminal and clock signals CK1, CK, B1, and B2 via a CK terminal, and triggers the gates of the light emitting thyristors D1-D8 in sequence.

A control circuit of a printing controller, not shown, provides an 8-bit digital signal to the driver circuit 210, the digital signal representing values of drive energy in 256 different levels. The driver circuit 210 is an IC that includes a digital-to-analog (D/A) converter 211 and resistors 212, and converts the 8-bit digital signal received from the control circuit into an analog signal having a corresponding one of 256 different voltages. The analog signal in turn is supplied to the anode of the light emitting thyristors D1-D8.

The D/A converter 211 includes D0-D7 terminals through which the 8-bit digital signal received from the control circuit of the printing controller, an IOUT, terminal connected to the anodes of the light emitting thyristors D1-D8, a CK terminal through which the D/A 211 receives clock signal CLK, and an FSA terminal connected to one end of a resistor 212. In accordance with a reference voltage generated in the D/A converter 211, the resistance value of the resistor 212 is selected such that a desired amount of output current is outputted from the IOUT terminal. The output current is zero when the digital signal is "00" in hexadecimal, and a maximum when the digital signal is "FF."

The integrated circuit of the second embodiment allows the drive current to be set in 256 different levels. Thus, even when the light emitting thyristors are different in light emitting efficiency, the drive current may be varied in different levels so that light emitting thyristors emit the same amount of light. This eliminates the need of discarding the light emitting thyristors D1-D8 when they are found different in emitted amount of light during the manufacturing process. Therefore, the second embodiment greatly improves yield of the light emitting thyristors and reduces manufacturing cost.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An integrated circuit that emits light the integrated circuit, comprising:
   a plurality of driver circuits each of which includes a first 3-terminal switch element, a second 3-terminal switch element, and a 3-terminal light emitting element driven by the first 3-terminal switch element, the first 3-terminal switch element in a first one of two adjacent driver circuits being driven by one of a first clock and a second clock, and the first 3-terminal switch element in a second one of the two adjacent driver circuits being driven by the other of the first clock and the second clock;
   wherein the second 3-terminal switch element in the first one of the two adjacent driver circuits supplies a signal to the second one of the two adjacent driver circuits, the signal representing an operational state of the first one of the two adjacent driver circuits;
   wherein said second 3-terminal switch element in the first one of the two adjacent driver circuits includes a first control electrode to which one of a third clock and a fourth clock that are different in rising timing and falling timing is supplied; and
   wherein said second 3-terminal switch element in the second one of the two adjacent driver circuits includes a second control electrode to which the other of the third clock and the fourth clock is supplied.

2. The integrated circuit according to claim 1, wherein said second 3-terminal switch element is a transistor.

3. The integrated circuit according to claim 1, wherein the 3-terminal light emitting element is driven by a data signal supplied to the 3-terminal light emitting element, the data signal driving the 3-terminal light emitting element at a timing and for a time length.

4. An integrated circuit that emits light in sequence, the integrated circuit comprising:
   a plurality of driver circuits aligned in a line, a preceding one of adjacent driver circuits being driven by a first set of drive signals and a following one of the adjacent driver circuits being driven by a second set of drive signals;
   wherein the preceding one of the adjacent driver circuits includes a first switch element, a first memory element that holds information indicative of a first active state of the preceding one of the adjacent driver circuits, and a first light emitting element that emits light, and the following one of the adjacent driver circuits includes a second switch element, a second memory element that holds information on a second active state of the following one of the adjacent driver circuits, and a second light emitting element that emits light;
   wherein the first set of drive signals drives the preceding one of the adjacent driver circuits such that the first switch element triggers the first memory element to hold the first active state, and then the first light emitting element emits light;
   wherein the second set of drive signals cooperates with the first active state to drive the following one of the adjacent driver circuits such that the second switch element triggers the second memory element to hold the second active state, and then the second light emitting element emits light;
   wherein the first memory element holds the first active state until the second memory element holds the second active state;
   wherein the first set of drive signals includes a first selector signal, a first clock, and a data signal, the second set of drive signals includes a second selector signal, a second clock, and the data signal, the first selector signal and the second selector signal being different in phase, the first clock signal and the second clock signal being different in phase;
   wherein the first selector signal causes the first switch element to trigger the first memory element so that the first memory element holds the first active state upon the first clock signal and sends the first active state to the first light emitting element;
   wherein when the first memory element holds the first active state, the first light emitting element emits light upon the data signal; and
   wherein the second selector signal cooperates with the first active state to trigger the second switch element so that the second memory element holds the second active state upon the second clock signal and sends the second active state to the second light emitting element, and then the second light emitting element emits light upon the data signal.

5. The integrated circuit according to claim 4, wherein the first and second switch elements are bipolar transistors.

6. The integrated circuit according to claim 4, wherein the first and second memory elements are light emitting thyristors covered with a metal layer.

7. The integrated circuit according to claim 4, wherein the first and second light emitting elements are light emitting thyristors and the data signal drives the first and second light emitting elements at a timing and for a time length.

8. An integrated circuit that emits light in sequence, the integrated circuit comprising:

a plurality of driver circuits aligned in a line, a preceding one of adjacent driver circuits being driven by a first set of drive signals and a following one of the adjacent driver circuits being driven by a second set of drive signals;

wherein the preceding one of the adjacent driver circuits includes a first switch element, a first memory element that holds information indicative of a first active state of the preceding one of adjacent driver circuits, and a first light emitting element that emits light, and the following one of the adjacent driver circuits includes a second switch element, a second memory element that holds information on a second active state of the following one of the adjacent driver circuits, and a second light emitting element that emits light;

wherein the first set of drive signals includes a first selector signal, a first clock, and a data signal, the second set of drive signals includes a second selector signal, a second clock, and the data signal, the first selector signal and the second selector signal being different in phase, the first clock signal and the second clock signal being different in phase;

wherein the first selector signal causes the first switch element to trigger the first memory element so that the first memory element holds the first active state upon the first clock signal and sends the first active state to the first light emitting element;

wherein when the first memory element holds the first active state, the first light emitting element emits light upon the data signal;

wherein the second selector signal cooperates with the first active state to trigger the second switch element so that the second memory element holds the second active state upon the second clock signal and sends the second active state to the second light emitting element, and then the second light emitting element emits light upon the data signal; and wherein the first memory element holds the first active state until the second memory element holds a second active state upon the second clock signal.

* * * * *